(12) United States Patent
Roberts

(10) Patent No.: US 7,105,881 B2
(45) Date of Patent: Sep. 12, 2006

(54) DRAMS CONSTRUCTIONS AND DRAM DEVICES

(75) Inventor: Martin Ceredig Roberts, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/325,159

(22) Filed: Dec. 19, 2002

(65) Prior Publication Data

US 2003/0124788 A1 Jul. 3, 2003

Related U.S. Application Data

(62) Division of application No. 09/941,375, filed on Aug. 28, 2001, now Pat. No. 6,645,806.

(60) Provisional application No. 60/310,938, filed on Aug. 7, 2001.

(51) Int. Cl.
H01L 27/108 (2006.01)
H01L 29/76 (2006.01)
H01L 29/94 (2006.01)
H01L 31/119 (2006.01)

(52) U.S. Cl. ............... 257/296; 257/336; 257/905

(58) Field of Classification Search ............... 257/334, 257/335, 336, 337, 338, 343, 344, 369, 408, 257/905, 296
See application file for complete search history.

(56) References Cited

U.S. PATENT DOCUMENTS

| 5,134,085 | A | * | 7/1992 | Gilgen et al. ............... 438/210 |
| 5,407,852 | A | | 4/1995 | Ghio et al. |
| 5,439,835 | A | * | 8/1995 | Gonzalez .................... 438/241 |
| 5,482,878 | A | | 1/1996 | Burger et al. |
| 5,661,048 | A | | 8/1997 | Davies et al. |
| 6,127,231 | A | | 10/2000 | Mori |
| 6,331,725 | B1 | * | 12/2001 | Dennison .................... 257/368 |
| 6,380,045 | B1 | * | 4/2002 | Guo ............................ 438/396 |
| 6,468,876 | B1 | * | 10/2002 | Ukita et al. ................. 438/396 |
| 6,545,904 | B1 | * | 4/2003 | Tran ........................... 365/149 |
| 6,576,965 | B1 | * | 6/2003 | Eikyu et al. ................ 257/408 |

* cited by examiner

*Primary Examiner*—Hoai Pham
(74) *Attorney, Agent, or Firm*—Wells St. John, P.S.

(57) ABSTRACT

The invention includes a DRAM device. The device has an access transistor construction, and the access transistor construction has a pair of source/drain regions. A halo region is associated with one of the source/drain regions of the access transistor construction and no comparable halo region is associated with the other of the source/drain regions of the access transistor construction. The invention also encompasses methods of forming DRAM devices.

26 Claims, 5 Drawing Sheets

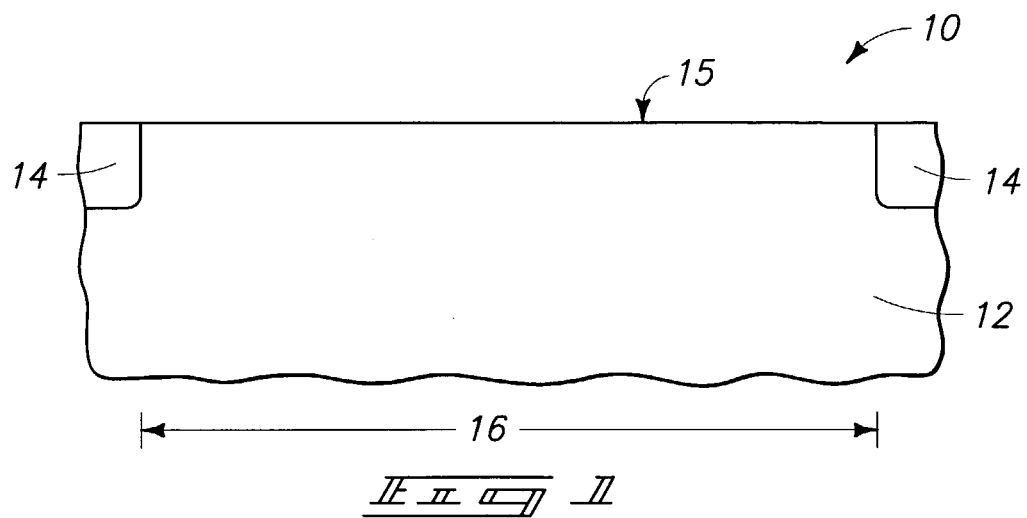
_FIG. 1_
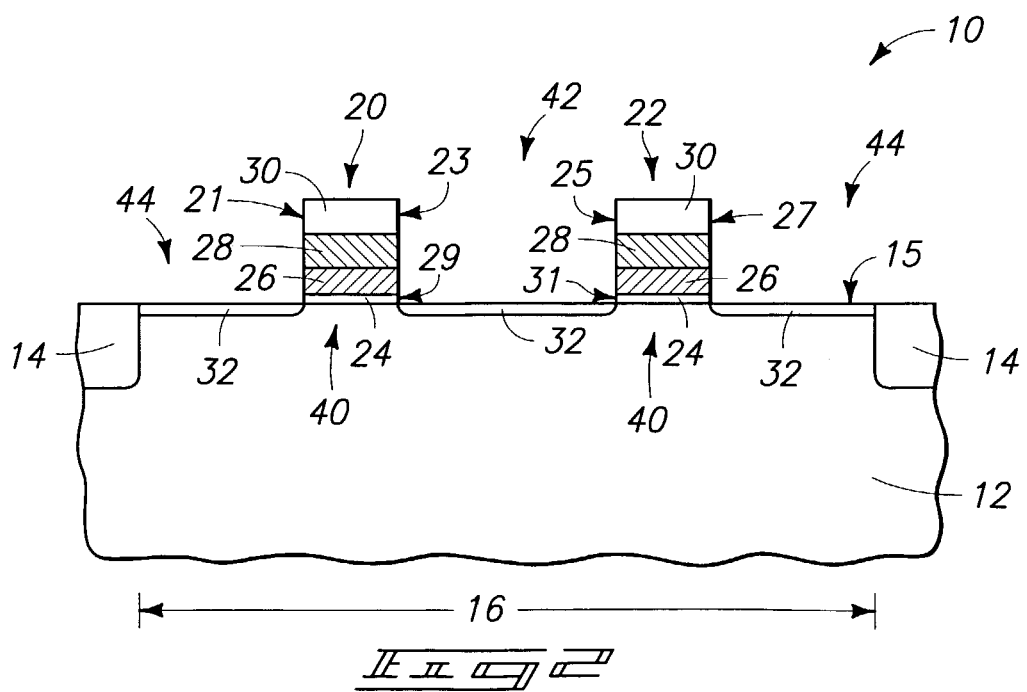
_FIG. 2_

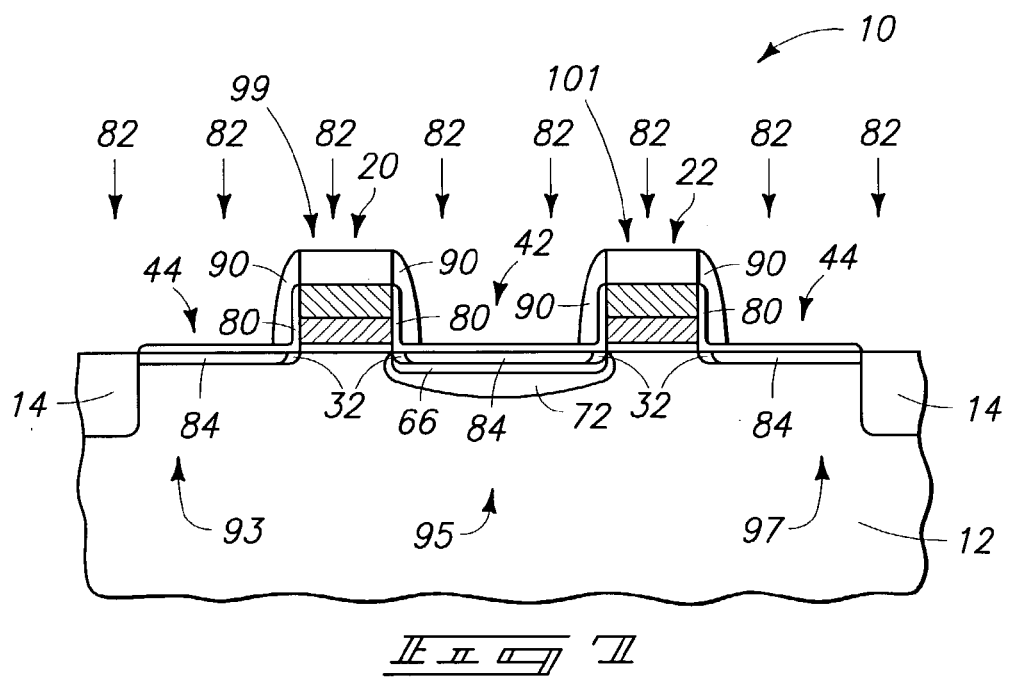
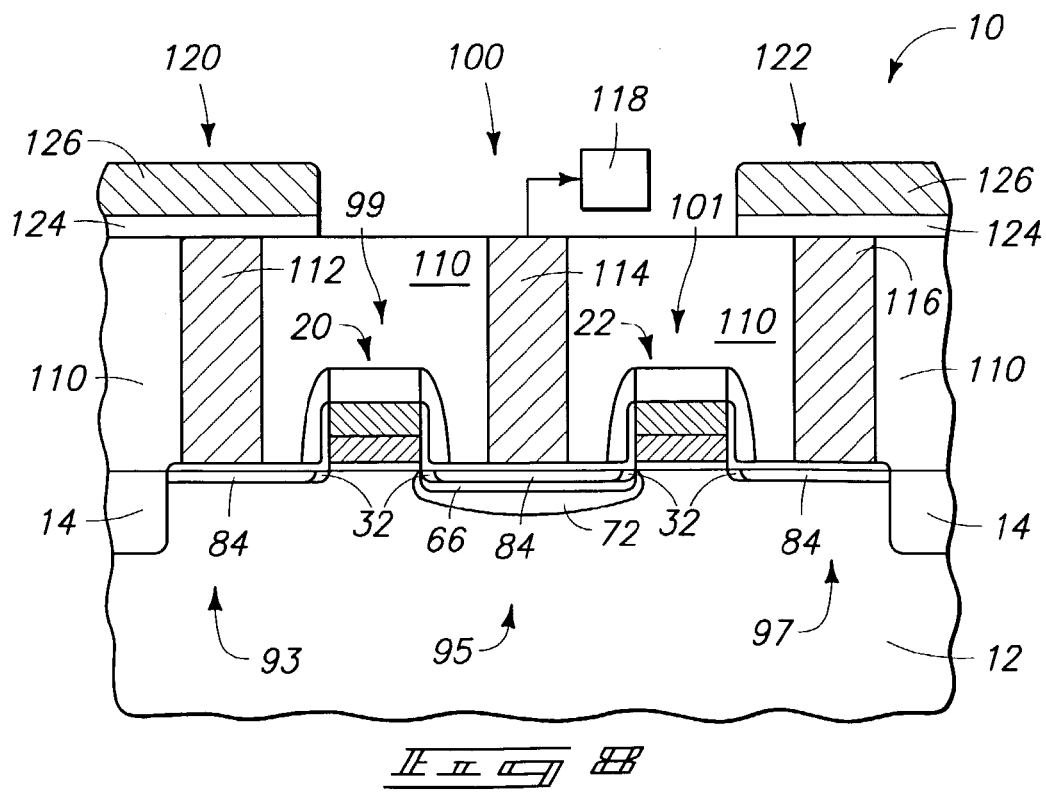

DRAMS CONSTRUCTIONS AND DRAM DEVICES

RELATED PATENT DATA

This patent resulted from a divisional of U.S. patent application Ser. No. 09/941,375, filed Aug. 28, 2001, now U.S. Pat. No. 6,645,806 B2, which claims priority to U.S. Provisional Application Ser. No. 60/310,938; which was filed on Aug. 7, 2001, the disclosure of which is hereby incorporated herein by reference.

TECHNICAL FIELD

The invention pertains to DRAM devices, and to methods of forming DRAM devices. In particular aspects, the invention pertains to methods of forming access transistor constructions for DRAM devices.

BACKGROUND OF THE INVENTION

Dynamic random access memory (DRAM) is commonly utilized for computer memory. DRAM is incorporated into integrated circuit chips. Such chips frequently comprise a memory array of DRAM devices, and further comprise logic devices provided around a periphery of the memory array. The logic devices can be referred to as peripheral devices.

There is a continuing goal to reduce the size of memory devices and peripheral devices to conserve valuable semiconductor substrate real estate. Another continuing goal is to utilize common fabrication steps during formation of peripheral and memory device structures to reduce the processing time utilized in forming a complete integrated circuit construction.

It would be desirable to develop methods for DRAM fabrication which allow utilization of relatively small memory device structures, and it would be further desirable if such methods could utilize fabrication steps in common with the fabrication of peripheral device circuitry.

SUMMARY OF THE INVENTION

In one aspect, the invention encompasses a method of forming a DRAM device. The device includes an access transistor construction having a pair of source/drain regions. A halo region is associated with one of the source/drain regions of the access transistor construction and no comparable halo region is associated with the other of the source/drain regions of the access transistor construction.

In another aspect, the invention encompasses a method of forming a DRAM device. A substrate is provided, and the substrate has an active area defined therein. A pair of transistor gate structures are formed over the active area of the substrate. The transistor gate structures are spaced from one another by a gap, and the active area comprises a first portion covered by the transistor gate structures and a second portion between the transistor gate structures. The active area further comprises a third portion which is neither between the transistor gate structures or covered by the transistor gates structures. A mask is formed over the third portion of the active area while leaving the second portion uncovered. While the mask is over the third portion of the active area, dopant is implanted into the opening in the mask at an angle to reach through the gap and to the substrate. A pair of capacitor structures and a bitline are formed. The bitline is gatedly connected to one of the capacitor structures through one of the transistor gate structures, and gatedly connected to the other of the capacitor structures through the other of the transistor gate structures.

In another aspect, the invention encompasses DRAM constructions.

BRIEF DESCRIPTION OF THE DRAWINGS

Preferred embodiments of the invention are described below with reference to the following accompanying drawings.

FIG. 1 is a diagrammatic, cross-sectional view of a semiconductor wafer fragment shown at a preliminary processing step of a method of the present invention.

FIG. 2 is a view of the FIG. 1 wafer fragment shown at a processing step subsequent to that of FIG. 1.

FIG. 7 is a view of the FIG. 1 wafer fragment shown at a processing step subsequent to that of FIG. 6.

FIG. 8 is a view of the FIG. 1 wafer fragment shown at a processing step subsequent to that of FIG. 7.

FIG. 9 illustrates a peripheral circuitry portion of the wafer of FIG. 1, and subjected to the processing of FIGS. 4–6.

DETAILED DESCRIPTION OF THE PREFERRED EMBODIMENTS

Figure 3:
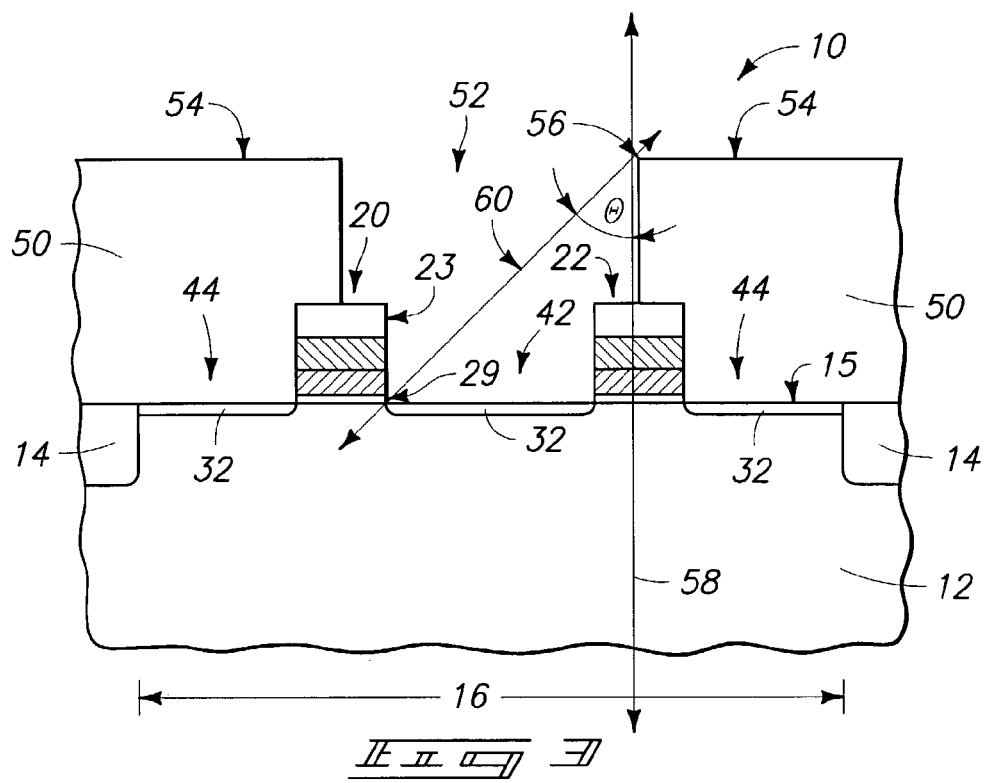
FIG. 3 is a view of the FIG. 1 wafer fragment shown at a processing step subsequent to that of FIG. 2.

A method of the present invention is described with reference to FIGS. 1–9. Referring initially to FIG. 1, a semiconductor wafer fragment 10 is illustrated at a preliminary processing step. Wafer fragment 10 comprises a substrate 12 having an upper surface 15, and isolation regions 14 formed therein. Substrate 12 can comprise, for example, monocrystalline silicon lightly-doped with a background p type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Isolation regions 14 can comprise, for example, shallow trench isolation regions comprising insulative material, such as silicon dioxide. An active region 16 is defined to extend between isolation regions 14. Active region 16 ultimately comprises source/drain regions (described with reference to FIGS. 3–9) gatedly connected through transistor gate constructions (described with reference to FIG. 2).

Referring next to FIG. 2, transistor gate constructions 20 and 22 are shown formed over substrate 12. Transistor gate constructions 20 and 22 can be referred to as a first transistor gate construction and a second transistor gate construction, respectively. Constructions 20 and 22 comprise a gate dielectric layer 24, a silicon layer 26, a metal silicide layer 28, and an insulative cap 30. Gate dielectric layer 24 will typically comprise silicon dioxide, silicon layer 26 will typically comprise conductively doped silicon, silicide layer 28 will typically comprise tungsten silicide or titanium silicide, and insulative cap 30 will typically comprise silicon nitride or silicon dioxide.

It is to be understood that the shown layers of gate constructions 20 and 22 are exemplary layers, and that other layers can be utilized in addition to, or alternatively to, the shown layers. For instance, a metal layer can be incorporated between silicide layer 28 and insulative cap 30.

Gate constructions 20 and 22 separate active area 16 into three regions. Specifically, gates constructions 20 and 22 define a first region 40 of active area 16 as the region beneath constructions 20 and 22; define a second region 42 of the active area 16 between gate constructions 20 and 22; and define a third region 44, which is the remaining portion of active region 16 not encompassed by either the first or second regions. In the discussion that follows, regions 44 can be referred to as outer source/drain region locations, and region 42 can be referred to as an inner source/drain region location.

Transistor gate constructions 20 and 22 can be considered to be transistor gate structures which are separated from one another by a gap corresponding to the region 42 of active area 16 between the gate structures 20 and 22. Gate structure 20 comprises a first sidewall 21 and a second sidewall 23 in opposing relation to first sidewall 21; and structure 22 comprises a first sidewall 25 and a second sidewall 27 in opposing relation to sidewall 25. Sidewalls 21 and 27 can be referred to as outer sidewalls of the gate structures, and sidewalls 23 and 25 can be referred to as inner sidewalls of the gate structures. Further, the gate structures 20 and 22 can be considered to comprise inner corners 29 and 31, respectively, where the inner sidewalls join to substrate 12.

Lightly doped diffusion regions (LDD regions) 32 are shown formed within substrate 12 and proximate structures 20 and 22. In particular embodiments, regions 32 comprise n-type dopant provided to a concentration of less than or equal to $10^{18}$ atoms/cm$^3$ within substrate 12. It is noted that the diffusion regions 32 can be omitted in particular embodiments of the present invention.

Referring to FIG. 3, a mask 50 is formed over substrate 12. Mask 50 can comprise, for example, photoresist. Mask 50 covers third portion 44 of active region 16, but does not cover the second portion 42 of active region 16. In other words, mask 50 does not cover the gap between transistor gate structures 20 and 22. Mask 50 has an opening 52 formed therein and extending over the gap between transistor gate structures 20 and 22. Mask 50 further comprises a top surface 54, and an edge 56 of the top surface which defines an upper periphery of opening 52.

A vertical projection 58 is shown extending upwardly through substrate 12, and approximately perpendicular to upper surface 15 of the substrate. A second projection 60 is defined to extend from top edge 56 to inner corner 29. Second projection 60 forms an angle "θ" with vertical projection 58. Angle "θ" can be referred to as a threshold angle, as angle "θ" defines a threshold dopant angle which determines if dopant can be implanted through opening 52 and to substrate 12. Specifically, if dopant is implanted at an angle greater than "θ", the dopant will not reach substrate 12. Instead, the dopant will impact sidewalls of opening 52 and portions of transistor gate structure 20. Alternatively, if dopant is implanted at an angle less than the threshold angle, it will impact substrate 12 within the gap defined by region 42.

Figure 4:
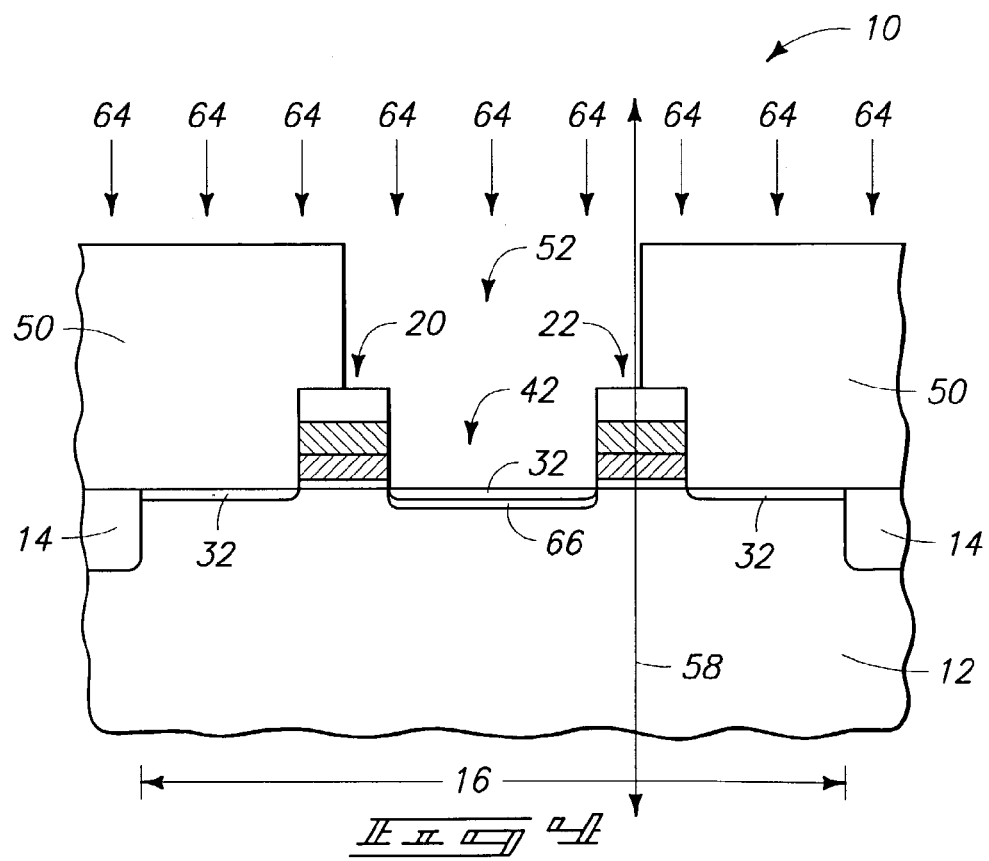
FIG. 4 is a view of the FIG. 1 wafer fragment shown at a processing step subsequent to that of FIG. 3.

Referring to FIG. 4, a first dopant 64 is implanted into opening 52 at a first angle of approximately 0° relative to vertical projection 58. Accordingly, dopant 64 is implanted at an angle less than the threshold angle "θ", and impacts substrate 12 within region 42 to form a implant region 66. Dopant 64 can comprise, for example, n type dopant (such as arsenic) and can be provided to a concentration of from about $10^{18}$ atoms/cm$^3$ to about $10^{19}$ atoms/cm$^3$.

Figure 5:
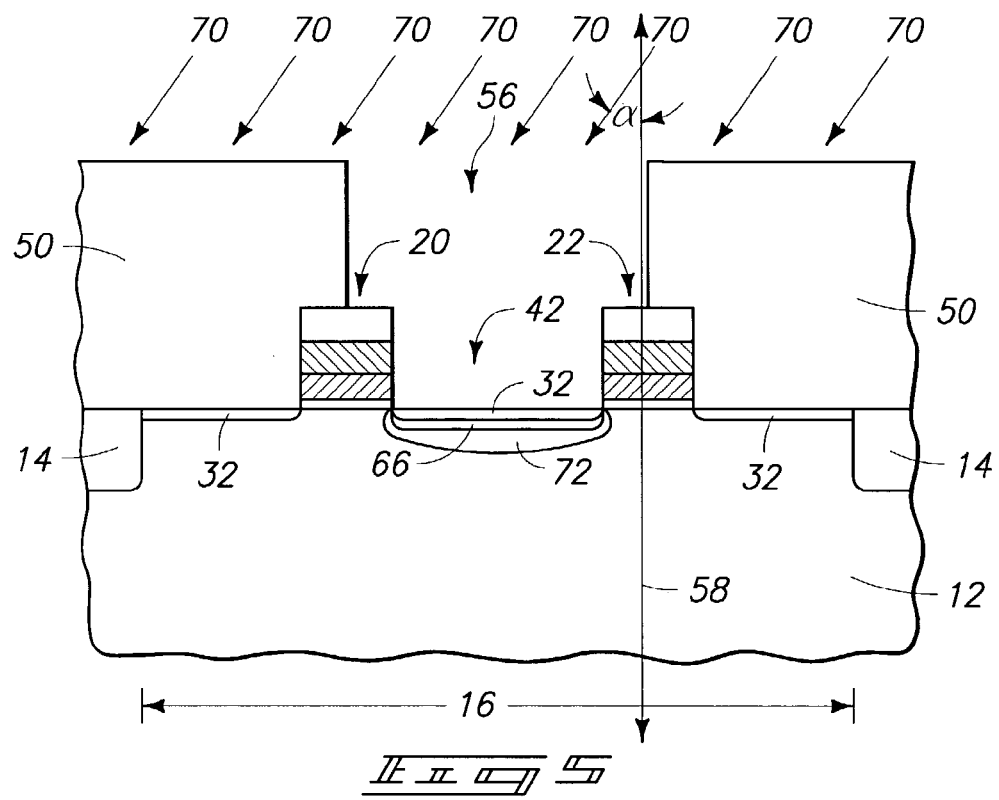
FIG. 5 is a view of the FIG. 1 wafer fragment shown at a processing step subsequent to that of FIG. 4.

Referring next to FIG. 5, a second dopant 70 is implanted into opening 56 at an angle "α" relative to vertical projection 58. Angle "α" is less than threshold angle "θ" and accordingly dopant 70 impacts substrate 12 within region 42 to form a implant region 72. In the shown embodiment, implant region 72 is deeper than region 66. It is to be understood, however, that the invention encompasses other embodiments wherein region 72 is implanted to be shallower than region 66. In particular embodiments, dopant 70 comprises a p type dopant (such as boron), and is implanted at an angle "α" greater than about 0° and less than about 20°. Further, the p type dopant is implanted at an energy of at least about 25 KeV, and a dose of at least about $10^{12}$ atoms/cm$^2$.

Figure 6:
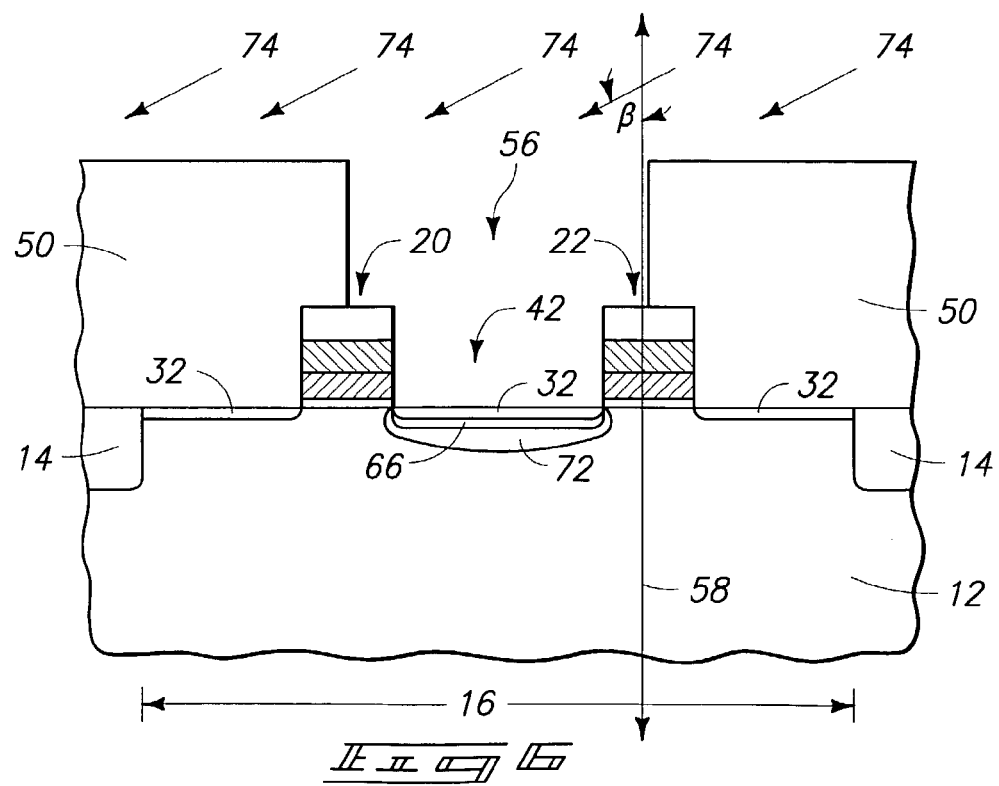
FIG. 6 is a view of the FIG. 1 wafer fragment shown at a processing step subsequent to that of FIG. 5.

Referring next to FIG. 6, a third dopant 74 is implanted at an angle "β" relative to vertical projection 58, with angle "β" being greater than the threshold angle θ. Accordingly, third dopant 74 does not reach substrate 12. Third dopant 74 can comprise, for example, p type dopant, and can be implanted at an angle "β" greater than or equal to 25°.

The dopants 64, 70 and 74 can be implanted into a peripheral region (described with reference to FIG. 9) associated with substrate 12 simultaneously with the implant of the dopants into the shown DRAM region. Dopant 74 can comprise an energy of at least about 50 KeV, and a dose of about 6×1011 atoms/cm$^2$. In the shown embodiment, angle " " is chosen to preclude impact of dopant 74 on substrate 12 within region 42. However, dopant 74 can be at an appropriate angle for implanting into regions of the substrate associated with various peripheral circuitry devices. A common mask can be utilized during the entire doping sequence for implanting of dopants 64, 70 and 74.

Referring to FIG. 7, mask 50 (FIG. 6) is removed and a thin insulative layer 80 is provided over exposed regions of substrate 12, as well as along sidewalls of transistor gate structures 20 and 22. Layer 80 can comprise, for example, silicon dioxide formed by exposing substrate 12 and transistor gate structures 20 and 22 to oxidizing conditions. It is noted that the invention encompasses other embodiments (not shown) wherein layer 80 is not formed.

A dopant 82 is implanted into substrate 12, after formation of layer 80, to form an LDD implant 84. LDD implant 84 overlaps with the previous LDD implant 32, and can comprise, for example, n-type dopant. It is to be understood that the invention encompasses embodiments wherein implant 82 is eliminated, as well as embodiments in which one of the implant regions 32 (FIG. 2) or 84 is eliminated, while the other is utilized. Accordingly, the implanting of dopants 64, 70 and 74 can occur before formation of LDD regions, after formation of LDD regions, or between a first LDD implant and a second LDD implant. Additionally, it is noted that the implanting of dopants 64, 70 and 74 can occur in any order relative to one another, such as, for example, with the implanting of the p-type dopants 70 and 74 occurring before the implanting of the n-type dopant 64.

After formation of layer 80, sidewall spacers 90 are formed along the sidewalls of transistor gate structures 20 and 22. Sidewall spacers 90 can comprise, for example, silicon dioxide or silicon nitride, and can be formed by anisotropically etching an appropriate insulative material layer.

In the processing step of FIG. 7, inner source/drain region location 42 comprises a source/drain region 95, and outer source/drain region locations 44 comprise source/drain regions 93 and 97. Source/drain regions 93 and 95, together with gate structure 20, define a first transistor construction 99; and source/drain regions 95 and 97, together with gate structure 22, define a second transistor construction 101. In other words, source/drain region 95 is gatedly connected to source/drain regions 93 and 97 through transistor gates 20 and 22, respectively. Source/drain region 95 can be considered to be a shared source/drain region, in that it is shared by first transistor construction 99 and second transistor construction 101.

Shared source/drain region 95 is different in dopant constituency than the outer source/drain regions 93 and 97. Specifically, source/drain region 95 comprises halo regions 72, and outer source/drain regions 93 and 97 do not comprise halo regions.

Although the shown invention comprises formation of NMOS transistor devices (i.e., devices in which the source/drain regions primarily comprise n-type regions, with a source/drain region which "primarily comprises n-type regions" being understood as a source/drain region which behaves generally as being n-type in character during operation of a device comprising the source/drain region), it is to be understood that the invention can also be utilized for formation of PMOS transistor devices. If the invention is utilized for formation of PMOS devices, the conductivity type of the regions 32, 84, 72 and 66 can be reversed relative to that described herein. In other words, conductivity regions 32, 84 and 66 are described as being n-type regions, but in a PMOS device such regions would correspond to p-type regions. Further, region 72 is described as being a p-type halo region in the shown NMOS construction, but in a PMOS construction would correspond to an n-type region.

Referring to FIG. 8, a DRAM construction 100 is formed utilizing the transistor devices of FIG. 7. Specifically, an insulative material 110 is formed over substrate 12, and conductive interconnects 112, 114 and 116 extend through the insulative material 110 to the source/drain regions 93, 95, and 97. Insulative material 110 can comprise, for example, borophosphosilicate glass (BPSG), and conductive interconnects 112 can comprise, for example, one or more of conductively-doped silicon, metal silicide, and elemental metal.

Conductive interconnect 114 is electrically connected with a bitline 118, which results in an electrical connection between shared source/drain region 95 and the bitline 118. Electrical connections 112 and 116 are incorporated into capacitor constructions 120 and 122, respectively. Specifically, a dielectric material 124 is formed over electrical connections 112 and 116, and a capacitor plate 126 is subsequently formed over the dielectric material 124. Accordingly, conductive interconnects 112 and 116 are incorporated into capacitor constructions 120 and 122 as storage nodes. Dielectric material 124 can comprise, for example, one or more of silicon dioxide, silicon nitride, or so-called high K dielectric materials, such as tantalum pentoxide. Capacitor plates 126 can comprise, for example, one or more of conductively-doped silicon, metal, or metal silicide.

Transistor constructions 99 and 101 define access transistors for the DRAM construction 100, in that transistor constructions 99 and 101 are utilized to provide access between bitline 118 and the capacitor constructions 120 and 122.

The processing described with reference to FIGS. 7 and 8 would typically occur while a mask is provided over peripheral circuitry, so that the processing of FIGS. 7 and 8 occurs only in a DRAM area of an integrated circuit structure. However, it should also be understood that various steps of the processing of FIGS. 7 and 8 will preferably be conducted simultaneously with steps utilized in the formation of peripheral circuit elements if a particular fabrication sequence is amenable to simultaneous formation of peripheral device components and DRAM memory components.

The implants of FIGS. 4 and 5 can provide particular advantages to DRAM structures formed in accordance with the present invention. The n-type implant 64 (FIG. 4) reduces n-resistance of shared source/drain region 95 for improved drive current and improved hot electron reliability. The p-type angled implant 70 (FIG. 5) increases the threshold voltage of the access devices 99 and 101. Utilization of the p-type implant only relative to source/drain region 95 (and not relative to source/drain regions 93 and 97) allows the threshold voltage to be increased for the access transistors, while providing the halo implanting only on the digit side of the devices and thereby not disrupting careful control of graded junctions on the storage sides of the devices. It can be desired to maintain careful control of graded junction regions on the storage node side of an access transistor in order to minimize junction leakage and maintain adequate data retention for the DRAM memory.

Figure 9:
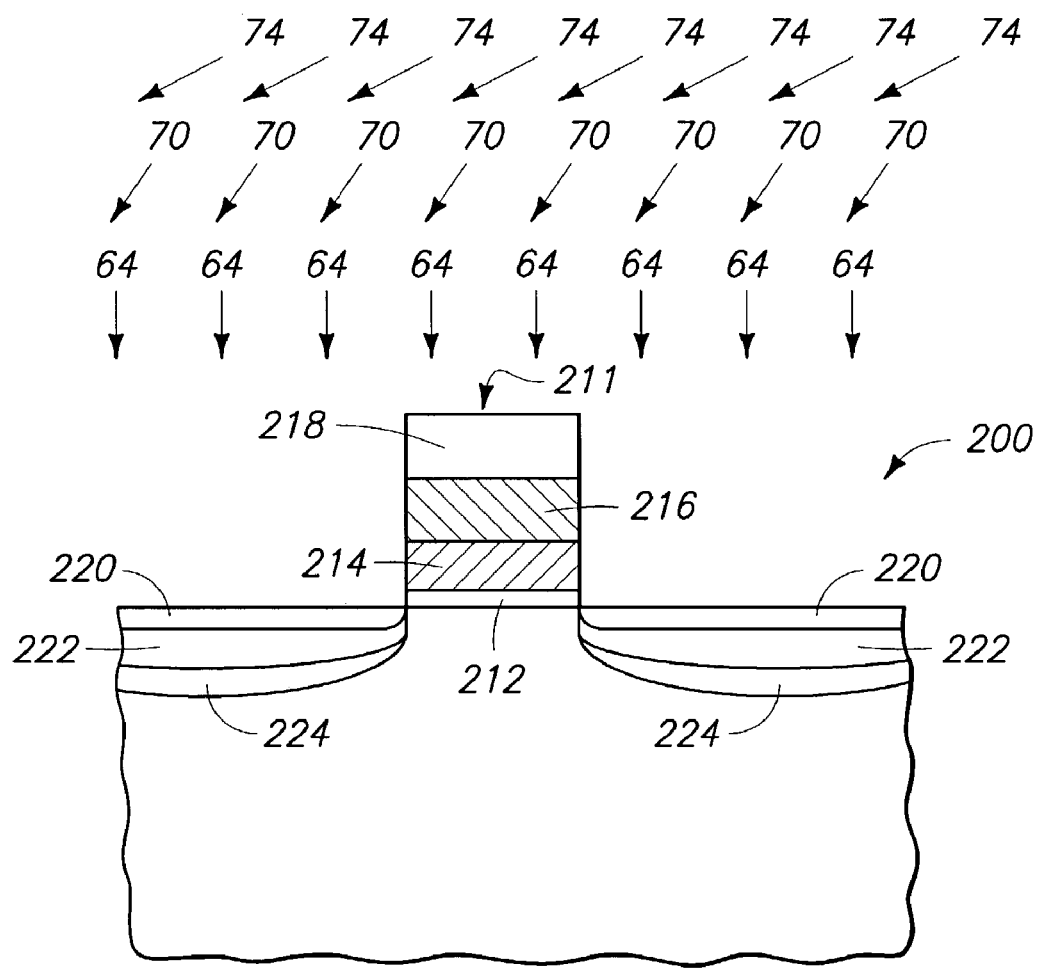
FIG. 9 is a view of the wafer of FIG. 1, illustrating a different fragment that that of FIG. 1. Specifically.

As described above, the processing of FIGS. 4–6 can be utilized to simultaneously form implanted regions within logic circuitry peripheral to a DRAM memory array. If it is assumed that the wafer fragment 10 of FIGS. 4–6 is associated with a DRAM memory array region, than the wafer comprising fragment 10 can comprise another fragment associated with logic circuitry peripheral to the memory array region. FIG. 9 illustrates a fragment 200 of the wafer. Fragment 200 is peripheral to the fragment 10 of FIGS. 1–8, and is associated with logic circuitry. A transistor gate structure 211 is shown formed over substrate 12. Gate structure 211 comprises a gate oxide 212, a silicon layer 214, a silicide layer 216 and an insulative cap 218. Layers 212, 214, 216 and 218 can comprise the same materials as described previously for layer 24, 26, 28 and 30, respectively.; Dopants 64, 70 and 74 are shown being implanted into substrate 12 proximate structure 211 to form implant regions 220, 222 and 224, respectively. The implanting of dopants 64, 70 and 74 into fragment 200 preferably occurs simultaneously with the implanting of dopants 64, 70 and 74 described previously with reference to FIGS. 4, 5 and 6. In other words, the implanting of each of dopants 64, 70 and 74 is preferably blanket implanting in the sense that the dopants are simultaneously implanted over memory array regions and logic regions peripheral to the memory array regions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A DRAM construction, comprising:
   a substrate comprising an upper surface;
   a first transistor gate structure over the substrate;
   a pair of source/drain regions within the substrate and on opposing sides of the first transistor gate structure from one another, the source/drain regions being gatedly connected to one another through the first transistor gate structure; one of the source/drain regions being a first source/drain region and the other of the source/drain regions being a second source/drain region, the first source/drain region comprising a plurality of conductivity-enhanced regions wherein at least two of the plurality of the conductivity-enhanced regions extend into the substrate an equal distance from the upper surface;
   a capacitor electrically connected with the first source/drain region;
   a bitline electrically connected with the second source/drain region;
   a halo region comprising at least a portion of the second source/drain region, and the first source/drain region comprising no halo region, and wherein the halo region extends into the substrate elevationally below a remainder of the second source/drain region; and
   a conductive interconnect providing the electrical connection between the capacitor and the first source/drain region.

2. The construction of claim 1 wherein the source/drain regions primarily comprise n-type doped regions, and wherein the halo region is a p-type doped region.

3. The construction of claim 1 further comprising:
   a second transistor gate structure over the substrate, the second source/drain region being between the first and second transistor gate structures;
   a third source/drain region on an opposing side of the second transistor gate structure from the second source/drain region, the second and third source/drain regions being gatedly connected to one another through the second transistor gate structure; the third source/drain region comprising no halo region; and
   a second capacitor in electrical connection with the third source/drain region.

4. The construction of claim 3 wherein the first, second and third source/drain regions primarily comprise n-type doped regions, and wherein the halo region is a p-type doped region.

5. The construction of claim 1 wherein the second source/drain region comprises another portion other than the halo region, and the halo region surrounds an entirety of the another portion of the second source/drain region within the substrate.

6. The construction of claim 1 wherein the plurality of the conductivity-enhanced regions comprises a plurality of lightly doped diffusion regions of the first source/drain region.

7. The construction of claim 1 wherein the second source/drain region comprises another portion other than the halo region, the another portion comprising a plurality of lightly doped diffusion regions.

8. The construction of claim 1 wherein the plurality of the conductivity-enhanced regions comprises a plurality of lightly doped diffusion regions of the first source/drain region, and wherein the second source/drain region comprises another portion other than the halo region, the another portion comprising a plurality of lightly doped diffusion regions.

9. The construction of claim 1 wherein the second source/drain region comprises at least three conductivity-enhanced regions.

10. The construction of claim 1 wherein the second source/drain region comprises at least three n-type conductivity-enhanced regions.

11. A DRAM device, comprising:
    a semiconductive material substrate;
    two source/drain regions within the substrate, one of the source/drain regions being a bitline contact of the DRAM device and the other of the source/drain regions being a capacitor contact of the DRAM device;
    a transistor gate gatedly connecting the two source/drain regions with one another, the transistor gate comprising a plurality of conductive layers; and
    wherein the two source/drain regions have different dopant constituencies relative to one another, and wherein each of the two source/drain regions comprises a plurality of implant regions, and wherein the one of the source/drain regions comprises at least four implant regions, and wherein at least three of the at least four implant regions comprise the same dopant constituencies.

12. The device of claim 11 wherein the different dopant constituencies include the bitline contact comprising a dopant that is not in the capacitor contact.

13. The device of claim 11 wherein the different dopant constituencies include the bitline contact comprising a halo region that is not within the capacitor contact.

14. The device of claim 11 further comprising a conductive interconnect electrically coupled to the capacitor contact to provide an electrical connection between a capacitor and the capacitor contact.

15. The device of claim 11 wherein the one of the source/drain regions comprises a plurality of lightly doped diffusion regions.

16. The device of claim 11 wherein the other of the source/drain regions comprises a plurality of lightly doped diffusion regions.

17. The device of claim 11 wherein the one of the source/drain regions comprises a plurality of lightly doped diffusion regions, and wherein the other of the source/drain regions comprises a plurality of lightly doped diffusion regions.

18. The device of claim 11 further comprising:
    a capacitor; and
    a conductive interconnect providing electrical connection between the capacitor and the capacitor contact.

19. The device of claim 11 wherein the at least three implant regions are n-type implant regions.

20. A DRAM construction, comprising:
    a substrate;
    a first transistor gate structure over the substrate;
    a pair of source/drain regions within the substrate and on opposing sides of the first transistor gate structure from one another, the source/drain regions being gatedly connected to one another through the first transistor gate structure, one of the source/drain regions being a first source/drain region and the other of the source/drain regions being a second source/drain region;
    a capacitor electrically connected with the first source/drain region;
    a bitline electrically connected with the second source/drain region;
    a halo region comprising at least a portion of the second source/drain region, and the first source/drain region comprising no halo region, and wherein the halo region extends into the substrate elevationally below a remainder of the second source/drain region; and wherein the source/drain regions primarily comprise n-type doped regions, and wherein the halo region is a p-type doped region, and wherein the second source/drain region comprises at least three n-type doped regions.

21. The construction of claim 20 further comprising a conductive interconnect to provide the electrical connection between the capacitor and the first source/drain region.

22. A DRAM construction, comprising:
a substrate;
a first transistor gate structure over the substrate;
a pair of source/drain regions within the substrate and on opposing sides of the first transistor gate structure from one another, the source/drain regions being gatedly connected to one another through the first transistor gate structure, one of the source/drain regions being a first source/drain region and the other of the source/drain regions being a second source/drain region;
a capacitor electrically connected with the first source/drain region;
a bitline electrically connected with the second source/drain region;
a halo region comprising at least a portion of the second source/drain region, and the first source/drain region comprising no halo region, and wherein the halo region extends into the substrate elevationally below a remainder of the second source/drain region;
a second transistor gate structure over the substrate and comprising an upper surface extending between opposite sidewalls, the second transistor gate structure comprising a pair of sidewall spacers extending over at least one of the sidewalls, and at least one sidewall spacer of the pair comprising an upper surface elevationally below the upper surface of the second transistor gate structure, the second source/drain region being between the first and second transistor gate structures;
a third source/drain region on an opposing side of the second transistor gate structure from the second source/drain region, the second and third source/drain regions being gatedly connected to one another through the second transistor gate structure, and the third source/drain region comprising no halo region;
a second capacitor in electrical connection with the third source/drain region, wherein a conductive interconnect provides the electrical connection between the second capacitor and the third source/drain region; and
wherein the first, second and third source/drain regions primarily comprise n-type doped regions, and wherein the halo region is a p-type doped region.

23. The construction of claim 22 wherein the second source/drain region comprises at least three n-type doped regions.

24. A DRAM device, comprising:
a semiconductive material substrate;
two source/drain regions within the substrate, one of the source/drain regions being a bitline contact of the DRAM device and the other of the source/drain regions being a capacitor contact of the DRAM device;
a transistor gate gatedly connecting the two source/drain regions with one another;
a conductive interconnect electrically coupled to the capacitor contact to provide an electrical connection between a capacitor and the capacitor contact; and
wherein the two source/drain regions have different dopant constituencies relative to one another, and wherein each of the two source/drain regions comprises a plurality of implant regions, and wherein the one of the two source/drain regions comprises three implant regions having the same type of dopant constituencies.

25. A DRAM construction, comprising:
a substrate;
a first transistor gate structure over the substrate;
a pair of source/drain regions within the substrate and on opposing sides of the first transistor gate structure from one another, the source/drain regions being gatedly connected to one another through the first transistor gate structure; one of the source/drain regions being a first source/drain region and the other of the source/drain regions being a second source/drain region, the first source/drain region comprising a plurality of conductivity-enhanced regions;
a capacitor electrically connected with the first source/drain region;
a bitline electrically connected with the second source/drain region;
a halo region comprising at least a portion of the second source/drain region, and the first source/drain region comprising no halo region, and wherein the halo region extends into the substrate elevationally below a remainder of the second source/drain region;
a conductive interconnect providing the electrical connection between the capacitor and the first source/drain region; and
wherein the second source/drain region comprises at least three n-type conductivity-enhanced regions.

26. A DRAM device, comprising:
a semiconductive material substrate;
two source/drain regions within the substrate, one of the source/drain regions being a bitline contact of the DRAM device and the other of the source/drain regions being a capacitor contact of the DRAM device;
a transistor gate gatedly connecting the two source/drain regions with one another, the transistor gate comprising a plurality of conductive layers;
wherein the two source/drain regions have different dopant constituencies relative to one another, and wherein each of the two source/drain regions comprises a plurality of implant regions, and wherein the one of the source/drain regions comprises at least four implant regions; and
wherein the one of the source/drain regions comprises at least three n-type implant regions.

* * * * *

UNITED STATES PATENT AND TRADEMARK OFFICE
CERTIFICATE OF CORRECTION

| | | |
|---|---|---|
| PATENT NO. | : 7,105,881 B2 | Page 1 of 1 |
| APPLICATION NO. | : 10/325159 | |
| DATED | : September 12, 2006 | |
| INVENTOR(S) | : Roberts | |

It is certified that error appears in the above-identified patent and that said Letters Patent is hereby corrected as shown below:

Col. 2, line 29, please delete "that" after "fragment" and insert --than--.

Col. 4, line 34, please delete "6X1011" after "about" and insert --$6 \times 10^{11}$--.

Col. 4, line 35, please delete """is" before "chosen" and insert --"β" is--.

Col. 6, line 37, please delete "than" after "region," and insert --then--.

Col. 6, line 48, please delete "tively.;" before "Dopants" and insert --tively.--.

Signed and Sealed this

Twenty-sixth Day of June, 2007

JON W. DUDAS
*Director of the United States Patent and Trademark Office*